Nov. 9, 1965 J. M. GAULT 3,217,215

FIELD EFFECT TRANSISTOR

Filed July 5, 1963

INVENTOR.
JOHN M. GAULT

BY

OSTROLENK, FABER, GERB & SOFFEN

United States Patent Office 3,217,215

Patented Nov. 9, 1965

3,217,215
FIELD EFFECT TRANSISTOR

John M. Gault, Manhattan Beach, Calif., assignor to International Rectifier Corporation, El Segundo, Calif., a corporation of California.

Filed July 5, 1963, Ser. No. 292,986
3 Claims. (Cl. 317—235)

My invention relates to a field effect transistor, and more specifically relates to a novel field effect transistor structure and method of producing such a structure.

In my copending application Serial No. 292,987 filed July 5, 1963 entitled "Field Effect Transistor" and assigned to the assignee of the present invention, I described therein a novel field effect transistor wherein conduction current is taken through a narrow P-type region which can have any desired length, whereby accurate control is achieved independently of the power requirements of the unit.

The present invention relates to a novel field effect transistor arrangement utilizing the basic concept shown in my above copending application with a geometry which lends itself to simplified manufacturing techniques.

Accordingly, a primary object of this invention is to provide a novel field effect transistor which is relatively simple to manufacture.

Another object of this invention is to provide a novel field effect transistor which has accurate control characteristics, and may have relatively high power outputs.

Another object of this invention is to provide a novel field effect transistor having an improved saturation current characteristic and which can be easily manufactured.

These and other objects of this invention will become apparent from the following description when taken in connection with the drawings, in which.

Figure 1:
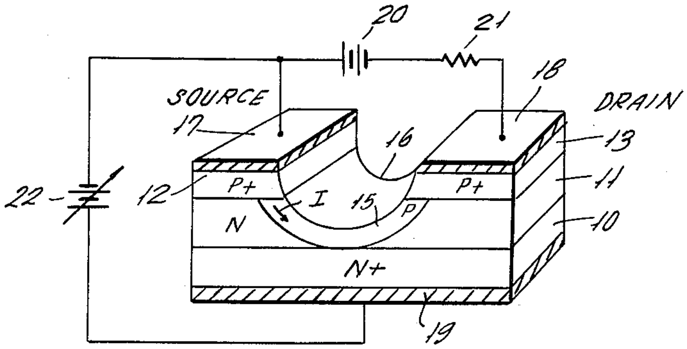
FIGURE 1 illustrates a perspective view of a field effect transistor manufactured in accordance with the present invention.
Figure 3:
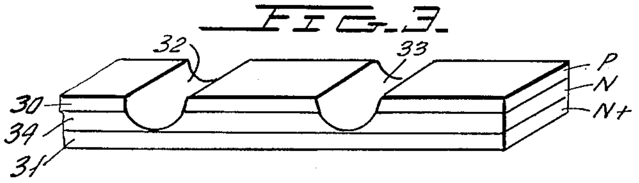

FIGURE 3 indicates a grooving step during the manufacturing process of the device of FIGURE 1.

Figure 4:
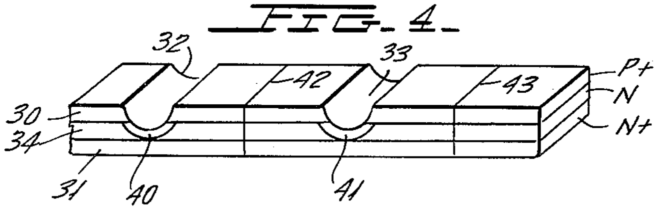

FIGURE 4 illustrates a finishing step in the manufacture of the device of FIGURE 1.

Referring first to FIGURE 1, I have illustrated therein my novel improved field effect transistor which is comprised of a silicon body having an N+ region 10 followed by an N region 11, and upper P+ regions 12 and 13. A P type region 15 is then located on the external surface of a groove 16 in the wafer and extends upwardly under the P+ regions 12 and 13, as illustrated. Electrodes 17 and 18 are then suitably applied to P+ regions 12 and 13 respectively, while a further electrode 19 is applied to the bottom of the N+ region 10. Preferably, the P region 15 will have a thickness of the order of ½ mil at the bottom of the grooves. It is this region which serves as the control or "pinch-off" region which controls current flow from regions 12 to 13.

In operation, a source of bias voltage 20 is connected to electrodes 17 and 18 and in series with an appropriate load means 21. A source of control voltage 22 is then connected from electrode 17 to the grid or gate electrode 19 and serves to control the flow of current I through the P type region 15.

More specifically, and in accordance with the principles set forth in my above noted copending application Serial No. 292,987, during operation, the application of voltage to the gate or grid electrode 19 will cause a space charge to expand into the restricted P type region 15, thus effectively increasing or reducing the effective conduction area for flow of current I from regions 12 to 13.

More specifically, this space charge will expand more easily into the P type region than it will into the P+ regions whereby saturation current will be reached at relatively low control voltages. Therefore, extremely good control characteristics will result.

So far as power capacity is concerned, it will be recognized that the device may be made with as great a breadth as desired so that any desired current capacity can be achieved.

The structure of FIGURE 1 is particularly advantageous in that it lends itself to simplified manufacturing techniques. A typical manner in which the device can be manufactured is illustrated in FIGURES 2, 3 and 4.

Figure 2:
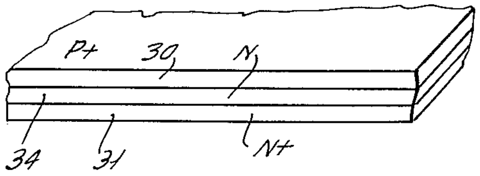
FIGURE 2 illustrates the basic wafer from which the device of FIGURE 1 may be fabricated.

Referring first to FIGURE 2, I have illustrated therein a basic wafer element having whatever desired length and depth is required and which has a thickness, for example, of 8 mils. This basic wafer could be of N type material, and may then be subjected to appropriate diffusion techniques to form a P+ region 30 extending from the top of the wafer for a distance of the order of 2½ mils. Thereafter, a second diffusion step may be performed to render the lower portion of the wafer 31 of the N+ type to a depth of approximately 2½ mils. This process will then leave the device, as illustrated in FIGURE 2, with a central N type region having a depth of approximately 3 mils.

Thereafter, and as illustrated in FIGURE 3, a plurality of parallel grooves such as grooves 32 and 33 are formed in the wafer to a depth of about 5 to 5½ mils so that it is just short of the junction between the N region 34 and the N+ region 31.

Thereafter, and as illustrated in FIGURE 4, the P type regions 40 and 41 are deposited in the grooves 32 and 33 as by vacuum diffusion of gallium or aluminum with low surface concentration with the P type regions having a thickness of the order of ½ mil at the bottom of the grooves. Thus, the P type regions will lie just atop the junction between the N region 34 and N+ region 31.

Thereafter, electrodes are plated on the upper and lower surfaces of the wafer. The wafer is then cut as at lines 42 and 43 of FIGURE 4 to define a plurality of devices identical to that of FIGURE 1.

Although I have described my novel invention with respect to preferred embodiments thereof, it should be understood that many variations and modifications will now be obvious to those skilled in the art, and I prefer, therefore, to be limited not by the specific disclosure herein but only by the appended claims.

The embodiments of the invention in which an exclusive privilege or property is claimed are defined as follows:

1. A field effect transistor comprising a body of N type conductivity material having a groove extending into a surface thereof, a first and second P+ regions extending into said body from said surface, a planar N+ region extending across the opposite surface of said body, and a P type region surrounding the walls of said groove adjacent said N type body; said P-type region at the bottom of said groove reaching said N+ planar region; said P type region joining said first and second P+ regions at the ends of said P type region.

2. The device of claim 1 wherein said P type region has a depth of the order of ½ mil at the bottom of said groove.

3. The device of claim 1 wherein said first and second P+ regions, and said N type body receive respective electrodes.

References Cited by the Examiner

UNITED STATES PATENTS

| | | | |
|---|---|---|---|
| 2,936,425 | 5/60 | Shockley | 317—235 |
| 2,954,551 | 9/60 | Ducette et al. | 317—235 |
| 2,967,985 | 10/61 | Shockley et al. | 317—235 |

DAVID J. GALVIN, *Primary Examiner.*

JAMES D. KALLAM, *Examiner.*